United States Patent
Hendrikse

(10) Patent No.: US 12,160,706 B2
(45) Date of Patent: Dec. 3, 2024

(54) HEARING DEVICE WITH PULSE POWER ESTIMATION, PULSE DETECTION, AND RELATED METHOD

(71) Applicant: GN Hearing A/S, Ballerup (DK)

(72) Inventor: Antonie Johannes Hendrikse, Eindhoven (NL)

(73) Assignee: GN HEARING A/S, Ballerup (DK)

( * ) Notice: Subject to any disclaimer, the term of this patent is extended or adjusted under 35 U.S.C. 154(b) by 208 days.

(21) Appl. No.: 17/946,011

(22) Filed: Sep. 15, 2022

(65) Prior Publication Data

US 2023/0018409 A1 Jan. 19, 2023

Related U.S. Application Data

(63) Continuation of application No. PCT/EP2021/056196, filed on Mar. 11, 2021.

(30) Foreign Application Priority Data

Mar. 11, 2020 (EP) .................................. 20162457

(51) Int. Cl.
*H04R 25/00* (2006.01)
*G10L 25/21* (2013.01)
(Continued)

(52) U.S. Cl.
CPC .......... *H04R 25/305* (2013.01); *H04R 25/43* (2013.01)

(58) Field of Classification Search
None
See application file for complete search history.

(56) References Cited

U.S. PATENT DOCUMENTS 7,676,372 B1  3/2010 Oba
8,923,542 B2 * 12/2014 Kilsgaard .............. A61B 5/291
                                                            381/322
(Continued)

FOREIGN PATENT DOCUMENTS

EP  3419310  12/2018

OTHER PUBLICATIONS

Extended European Search Report for EP Patent Appln. No. 201602457.4 dated Apr. 28, 2020.
(Continued)

*Primary Examiner* — Qin Zhu
(74) *Attorney, Agent, or Firm* — Vista IP Law Group, LLP

(57) ABSTRACT

Hearing device and method of power estimation and/or pulse detection in a hearing device is disclosed. The method comprises obtaining a pulse input signal; determining if the pulse input signal satisfies a first rising criterion; in accordance with the input signal satisfying the first rising criterion, increasing a threshold; determining if the pulse input signal satisfies a first down count criterion; in accordance with the pulse input signal satisfying the first down count criterion, initializing a down counter; determining if the down counter satisfies a second down count criterion; in accordance with the down counter satisfying the second down count criterion, decreasing the down counter; determining if the down counter satisfies a pulse detection criterion; and in accordance with the down counter satisfying the pulse detection criterion, outputting a pulse output signal indicative of detection of a pulse.

12 Claims, 5 Drawing Sheets

(51) Int. Cl.
*G10L 25/90* (2013.01)
*H03G 7/00* (2006.01)
*H03G 9/02* (2006.01)

(56) References Cited

U.S. PATENT DOCUMENTS

| | | | |
|---|---|---|---|
| 9,437,213 | B2 | 9/2016 | Zakarauskas et al. |
| 2002/0012438 | A1 | 1/2002 | Leysieffer et al. |
| 2006/0206320 | A1 | 9/2006 | Li |
| 2010/0105266 | A1 | 4/2010 | Olver |
| 2011/0135126 | A1* | 6/2011 | Gozen .................. H04R 25/505 381/313 |
| 2012/0215532 | A1 | 8/2012 | Foo et al. |
| 2017/0118326 | A1 | 4/2017 | Mani et al. |
| 2018/0176696 | A1 | 6/2018 | Voigt Pedersen |
| 2019/0261098 | A1 | 8/2019 | Kavalekalam et al. |
| 2019/0327564 | A1* | 10/2019 | Pedersen ............... H04W 52/50 |
| 2020/0204930 | A1* | 6/2020 | Oddershede ........ G10L 21/0208 |

OTHER PUBLICATIONS

PCT International Search Report and Written Opinion for International Appln. No. PCT/EP2021/056196 dated Mar. 29, 2021.

Lopatka K et al: "Detection, classification and localization of acoustic events in the presence of background noise for acoustic surveillance of hazardous situations", Multimedia Tools and Applications, Kluwer Academic Publishers, Boston, US, vol. 75, No. 17, Dec. 2, 2015 (Dec. 2, 2015), pp. 10407-10439, XP036044331, ISSN: 1380-7501, DOI: 10.1007/S11042-015-3105-4 [retrieved on Dec. 2, 2015] p. 10411 equations I, 2.

Final Office Action for U.S. Appl. No. 17/331,094 dated Dec. 12, 2023.

Non-Final Office Action for U.S. Appl. No. 17/331,094 dated May 24, 2023.

Notice of Allowance for U.S. Appl. No. 17/331,094 dated Mar. 28, 2024.

Foreign 1st Technical Exam Report for Danish Patent Appln. No. PA 2020 70387 dated Dec. 14, 2020.

Partial European Search Report for EP Patent Appln. No. 21179486.2 dated Apr. 8, 2022.

Kaustubh Banninthaya K., et al., "Reconfigurable Warped Digital Filter Architecture for Hearing Aid," Proceedings of the Fourth International Conference on Communication and Electronics Systems (ICCES 2019).

Extended European Search Report for EP Patent Appln. No. 21179486.2 dated Jul. 11, 2022.

Foreign 2nd Technical Exam Report for Danish Patent Appln. No. PA 2020 70387 dated Jul. 14, 2021.

* cited by examiner

HEARING DEVICE WITH PULSE POWER ESTIMATION, PULSE DETECTION, AND RELATED METHOD

RELATED APPLICATION DATA

This application is a continuation of International Patent Application No. PCT/EP2021/056196 filed on Mar. 11, 2021, which claims priority to, and the benefit of, European Patent Application No. 20162457.4 filed on Mar. 11, 2020. The entire disclosures of the above applications are expressly incorporated by reference herein.

FIELD

The present disclosure relates to a hearing device and related methods including a method of operating a hearing device.

BACKGROUND

Power estimation is at the heart of many hearing device functionalities. In particular, power estimation is used in implementation of (frequency specific) compression. The target in compression is to restore audibility by providing a gain that depends on the current power of the signal for various frequency bands.

Power estimation is a balance between smoothing to reduce variance in the estimate and maintaining dynamic behaviour, i.e. being able to track signal changes fast. A classical assumption made in design of power estimators is that the speech power changes little within a syllable. However, for pulsed power sources the power is only cyclo-stationary, i.e. the power is not distributed evenly within one period.

SUMMARY

Accordingly, there is a need for hearing devices and methods with improved power estimation and in particular more accurate power estimation of pulsed power sources.

A method of power estimation and/or pulse detection in a hearing device, the method comprising obtaining a pulse input signal; determining if the pulse input signal satisfies a first rising criterion; in accordance with the input signal satisfying the first rising criterion, updating and/or increasing a threshold; determining if the pulse input signal satisfies a first down count criterion; in accordance with the pulse input signal satisfying the first down count criterion, initializing a down counter; determining if the down counter satisfies a second down count criterion; in accordance with the down counter satisfying the second down count criterion, updating and/or decreasing the down counter; determining if the down counter satisfies a pulse detection criterion; and in accordance with the down counter satisfying the pulse detection criterion, outputting a pulse output signal indicative of detection of a pulse. The method optionally comprises estimating, e.g. calculating and/or determining, one or more powers of an input signal based on the pulse output signal.

A hearing device is disclosed, the hearing device comprising a pulse detector for provision of a pulse output signal indicative of detection of a pulse; a first power estimator connected to the pulse detector, the first power estimator configured for provision of a first power output based on a first power input and the pulse output signal; and a mixing module connected to the first power estimator for provision of a mixed output signal based on the first power output and a filterbank output. The pulse detector is configured to obtain a pulse input signal; determine if the pulse input signal satisfies a first rising criterion; in accordance with the input signal satisfying the first rising criterion, increase the threshold; determine if the pulse input signal satisfies a first down count criterion; in accordance with the pulse input signal satisfying the first down count criterion, initialize a down counter; determine if the down counter satisfies a second down count criterion; in accordance with the down counter satisfying the second down count criterion, decrease the down counter; determine if the down counter satisfies a pulse detection criterion; and in accordance with the down counter satisfying the pulse detection criterion, output the pulse output signal indicative of detection of a pulse.

Also disclosed is a pulse detector as described herein.

It is an important advantage of the present disclosure that a robust and failsafe pulse detection is provided. In particular, the number of false positives in the pulse detection is heavily reduced.

It is an advantage of the present disclosure that the estimation delay is well under one period of the input signal in turn providing a fast pulse detection. On the other hand, local maxima leading to false positives are reduced and thereby providing fast, accurate and reliable pulse detection.

It is an advantage of the present disclosure that each period in the power estimation comprises one pulse. In particular, the present disclosure facilitates that a pulse moment does not occur at the start or end of a period in turn making the pulse power estimate more robust. By aligning the smoothing periods with the end of the hold periods (when a pulse is detected in accordance with the pulse detection criterion being satisfied), a slight error has a much smaller impact on the (power) estimate.

BRIEF DESCRIPTION OF THE DRAWINGS

The above and other features and advantages will become readily apparent to those skilled in the art by the following detailed description of exemplary embodiments thereof with reference to the attached drawings, in which.

DETAILED DESCRIPTION

Figure 1:
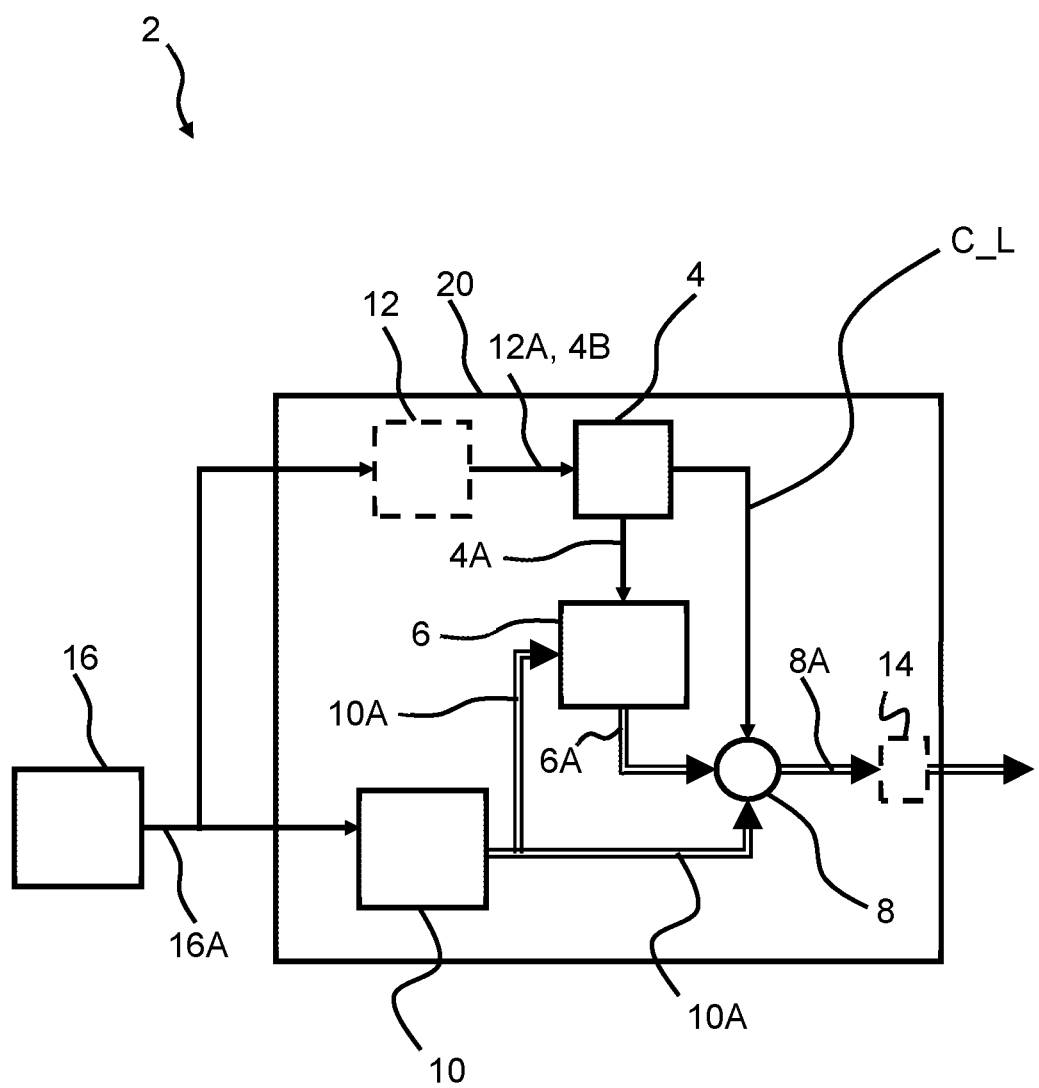
FIG. 1 schematically illustrates an exemplary hearing device.

Various exemplary embodiments and details are described hereinafter, with reference to the figures when relevant. It should be noted that the figures may or may not be drawn to scale and that elements of similar structures or functions are represented by like reference numerals throughout the figures. It should also be noted that the figures are only intended to facilitate the description of the embodiments. They are not intended as an exhaustive description of the invention or as a limitation on the scope of the invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated, or if not so explicitly described.

A hearing device is disclosed. The hearing device may be a hearable or a hearing aid, wherein the processor is configured to compensate for a hearing loss of a user.

The hearing device may be of the behind-the-ear (BTE) type, in-the-ear (ITE) type, in-the-canal (ITC) type, receiver-in-canal (RIC) type or receiver-in-the-ear (RITE) type. The hearing aid may be a binaural hearing aid. The hearing device may comprise a first earpiece and a second earpiece, wherein the first earpiece and/or the second earpiece is an earpiece as disclosed herein.

The hearing device comprises an input module comprising a set of microphones. The set of microphones may comprise one or more microphones. The set of microphones comprises a first microphone for provision of a first microphone input signal and/or a second microphone for provision of a second microphone input signal. The set of microphones may comprise N microphones for provision of N microphone signals, wherein N is an integer in the range from 1 to 10. In one or more exemplary hearing devices, the number N of microphones is two, three, four, five or more. The set of microphones may comprise a third microphone for provision of a third microphone input signal. The input module provides one or more input signals, e.g. based on one or more microphone signals and/or one or more transceiver input signals. The input module may be configured to pre-process microphone input signal(s) and/or transceiver input signal(s), the pre-processing optionally including beamforming and/or feedback suppression. In other words, the input module may comprise a pre-processor optionally including a beamforming module and/or a feedback suppressor. An input signal from the input module may be fed as the pulse input signal to the pulse detector.

Methods and hearing devices with improved and more accurate pulse detection and/or power estimation are provided. Further, pulse detectors with improved pulse detection is provided.

A method of power estimation and/or pulse detection in a hearing device is disclosed, the method comprising obtaining a pulse input signal and determining, e.g. in a first state, if the pulse input signal satisfies a first rising criterion. The method comprises, in accordance with the input signal satisfying the first rising criterion, increasing a threshold; and determining, e.g. in a second state, if the pulse input signal satisfies a first down count criterion. The method comprises, in accordance with the pulse input signal satisfying the first down count criterion, initializing a down counter; and determining, e.g. in a third state, if the down counter satisfies a second down count criterion. The method comprises, in accordance with the down counter satisfying the second down count criterion, decreasing the down counter. The method comprises determining, e.g. in the third state, if the down counter satisfies a pulse detection criterion; and in accordance with the down counter satisfying the pulse detection criterion, outputting a pulse output signal indicative of detection of a pulse.

The method may comprise, in accordance with the pulse input signal satisfying the first rising criterion, moving from a first or initial state to a second or rising state. The method may in the second state increase the threshold, e.g. based on the pulse input signal.

The first rising criterion, also denoted $RC\_1$, may comprise or be given by:
$x>TH\_1$,
where x is the pulse input signal or based on the pulse input signal, and $TH\_1$ is a threshold. The threshold $TH\_1$ may be a fixed threshold or an adaptive threshold. The pulse detector may be configured to adapt or update the threshold $TH\_1$ e.g. in accordance with the first rising criterion not being satisfied.

The method may comprise determining, e.g. in the first state, if the pulse input signal satisfies a first stay criterion. The method optionally comprises, e.g. in accordance with the pulse input signal satisfying the first stay criterion, updating, e.g. decreasing and/or resetting, the threshold and/or staying in the first state.

The first stay criterion, also denoted $SC\_1$, may comprise or be given by:
$x=<TH\_1$,
where x is the pulse input signal or based on the pulse input signal, and $TH\_1$ is the threshold. The pulse detector may be configured to adapt or update the threshold $TH\_1$ in accordance with the pulse input signal satisfying the first stay criterion.

The method may comprise, e.g. in accordance with the pulse input signal satisfying the first down count criterion, moving from the second state to a third or down count state. The method may, e.g. in the third state or when moving from the second state to the third state, comprise initializing a down counter. The method may comprise, e.g. in accordance with the pulse input signal satisfying the first down count criterion, initializing a down counter. Initializing a down counter may be based on an expected fundamental period also denoted $t\_fund$. In one or more exemplary methods/pulse detectors, initializing a down counter comprises setting the down counter c to a value based on the expected fundamental period, e.g. $c=t\_fund/3$, where c is the down counter and $t\_fund$ is an expected fundamental period. In other words, the down counter (c) may be initialized at ⅓ of the expected fundamental period ($t\_fund$).

The first down count criterion, also denoted $DCC\_1$, may comprise or be given by:
$x<TH\_1$,
where x is the pulse input signal or based on the pulse input signal, and $TH\_1$ is the threshold.

The method may comprise determining, e.g. in the second state, if the pulse input signal satisfies a second stay criterion. The method optionally comprises, e.g. in accordance with the pulse input signal satisfying the second stay criterion, updating the threshold and/or staying in the second state. Updating the threshold may comprise setting or calculating the threshold based on the pulse input signal, e.g. equalizing the threshold $TH\_1$ to the pulse input signal x. In other words, updating the threshold may comprise setting the threshold to the value of the pulse input signal. In other words, the first down count criterion may be based on one or more of the down counter c, the pulse input signal x, and the threshold $TH\_1$.

The second stay criterion, also denoted $SC\_2$, may comprise or be given by:
$x>=TH\_1$,
where x is the pulse input signal or based on the pulse input signal, and $TH\_1$ is the threshold. The method/pulse detector may be configured to adapt or update the threshold $TH\_1$ in accordance with the pulse input signal satisfying the second stay criterion.

The method comprises determining, e.g. in a third state, if the down counter satisfies a second down count criterion. The second down count criterion, also denoted $DCC\_2$, may comprise or be given by:
$c>0$,
where c is the down counter. The method comprises, optionally in accordance with the down counter satisfying the second down count criterion, updating, such as decreasing, the down counter. The second down criterion may also be denoted a third stay criterion.

In one or more exemplary methods, the second down count criterion may comprise or be given by:

$x =< TH\_1$, where x is the pulse input signal or based on the pulse input signal, and TH_1 is the threshold. In other words, the second down count criterion may be based on one or more of the down counter c, the pulse input signal x, and the threshold.

The method comprises determining, e.g. in the third state, if the down counter satisfies a pulse detection criterion. The pulse detection criterion, also denoted PDC, may be based on the down counter and/or the threshold. The method may comprise, e.g. in accordance with the down counter satisfying the pulse detection criterion, moving from the third state to the first state or a fourth state.

The pulse detection criterion may comprise or be given by:

$c=0$ or $c<0$, where c is the down counter. In other words, the pulse detection criterion is satisfied (i.e. pulse detected) in case the pulse input signal x has been decreasing for a period of time after a pulse input signal has peaked.

In one or more exemplary methods, the method comprises determining, e.g. in the third state and/or after determining that the pulse input signal satisfies the first down count criterion, if the pulse input signal satisfies a second rising criterion. The method may comprise, e.g. in accordance with the pulse input signal satisfying the second rising criterion, increasing the threshold and/or moving to the second state. Thus, the method may move back to the rising/second state if the detected maximum of the pulse input signal was merely a temporal maximum. Thereby the number of false positives (pulse detected) is reduced.

The second rising criterion, also denoted RC_2, may comprise or be given by:

$x>TH\_1$, where x is the pulse input signal or based on the pulse input signal, and TH_1 is the threshold. The method/pulse detector may be configured to adapt or update the threshold TH_1 e.g. in accordance with the second rising criterion being satisfied.

In one or more exemplary methods, the method comprises determining, e.g. in the first state and/or after determining that the down counter satisfies the pulse detection criterion, if the pulse input signal satisfies a rest criterion. The method may comprise, e.g. in accordance with the pulse input signal satisfying the rest criterion, decreasing the threshold and/or stay in the first state. In other words, the rest criterion may also be referred to as the first stay criterion, see above.

In one or more exemplary methods, initializing a down counter comprises estimating, such as determining/calculating/obtaining, a pulse period; and/or setting the down counter based on the estimated pulse period. The estimated pulse period may be an expected fundamental period also denoted t_fun. The method may comprise determining/calculating/obtaining the expected fundamental period, e.g. in the first state or when moving to the first state from the third state. The expected fundamental period may be based on the time between detection of a current or latest pulse/peak and detection of the previous pulse. In other words, the expected fundamental period may be based on the time between the current act of moving to the first state and the previous act of moving to the first state. The estimated pulse period may be In the method, estimating a pulse period may be based on the detection of several previous pulses. In one or more exemplary methods, the pulse output signal comprises the estimated pulse period. In other words, the pulse output signal may be indicative of or comprises a period of the latest detected pulse.

In one or more exemplary methods/pulse detectors, initializing a down counter comprises setting the down counter c to a value based on the expected fundamental period, e.g. $c=t\_fun/3$, where c is the down counter and t_fun is an expected fundamental period. In other words, the down counter (c) may be initialized at ⅓ of the expected fundamental period (t_fun). The expected fundamental period t_fund may be a fixed value. The expected fundamental period t_fun may be in the range from 2.0 ms to 16 ms, such as in the range from 2.9 ms to 14 ms. Thereby, accurate capturing of human speech is facilitated since the fundamental frequency range of voiced speech (one example of a pulsed power signal) is roughly in the range of 70 Hz to 350 Hz. The expected fundamental period may be determined, e.g. in the first state or when moving to the first state from the third state.

In one or more exemplary methods, the pulse output signal comprises a pulse height of the detected pulse. In other words, the pulse output signal may be indicative of or comprises an amplitude of the detected pulse. In one or more exemplary methods, the method comprises determining a pulse height based on the threshold TH_1. For example, the pulse height P_height may be given as:

$P\_height=TH\_1$.

In other words, the pulse height P_height may be the value of the threshold TH_1 at the time of moving to the first state, corresponding to the maximum value of the pulse input signal in the second state (where the threshold TH_1 is updated).

In one or more exemplary methods, the method comprises determining, e.g. after determining that the pulse input signal satisfies the first down count criterion, in the first state, in the second state, and/or in the third state, if a timeout criterion is satisfied. The method may comprise, e.g. in accordance with the timeout criterion, also denoted TOC, being satisfied, resetting the threshold and/or moving to the first state. The method may comprise, e.g. in accordance with the timeout criterion being satisfied, updating such as reducing a confidence level and/or performing prediction as if a pulse was detected, e.g. at timeout. The timeout criterion may be based on a timer counter t. The timer counter, also denoted tc may be initialized when moving from the first state to the second state, i.e. when the first rising criterion is satisfied.

In one or more exemplary methods, the method comprises estimating an estimated pulse period PP_est based on the detected pulse and/or a previously detected pulse, e.g. when moving from the third state to the first state and/or in accordance with the pulse detection criterion being satisfied.

In one or more exemplary methods, the method comprises estimating an estimated pulse height P_height_est based on the detected pulse and/or one or more previously detected pulses. Determining a pulse height may be based on the estimated pulse height. Estimating an estimated pulse height may comprise filtering pulse heights, e.g. with a weighting filter and/or a leaky average filter, e.g. such that the latest pulse height has the largest impact.

In one or more exemplary methods, the method comprises smoothing or averaging a first power input based on the pulse output signal for provision of a first power output. The method optionally comprises processing, such as mixing and/or filtering with a mixer, the first power output and/or a filterbank output for provision of a mixed output signal. The mixer may be controlled by a confidence parameter of the pulse output signal. It is to be understood that smoothing may be performed on absolute values instead of squared values ("power domain"). Using absolute values for smoothing may potentially save computation power and makes the smoothing more robust, e.g. in case of spike noise. In other words, the method may comprise smoothing a first input based on the pulse output signal for provision of a first output. The method optionally comprises processing, such as mixing and/or filtering with a mixer, the first output and/or a filterbank output for provision of a mixed output signal.

In one or more exemplary methods, the method comprises, e.g. when moving from the third state to the first state, in the fourth state, in accordance with the pulse detection criterion being satisfied, or in accordance with the timeout criterion being satisfied, determining a confidence level also denoted C_L. The confidence level C_L may be indicative of accuracy of the pulse detection (height and/or period), such as the likehood of the pulse input signal being a periodic or semi-periodic pulse signal. Processing, such as mixing and/or filtering, the first power output and/or a filterbank output for provision of a mixed output signal may be based on or controlled by the confidence level. In particular, mixing the first power output and a filterbank output for provision of a mixed output signal may be based on the confidence level.

Determining a confidence level may comprise comparing the detected pulse (e.g. time of occurrence and/or height/amplitude) with one or more previously detected pulses and/or estimates derived therefrom such as an estimated/predicted pulse height P_height_est and/or a previously estimated/predicted pulse period.

The confidence level may be based on a comparison of the occurrence of a pulse or peak and an estimated occurrence of the pulse or peak. In other words, an estimated pulse period (based on previous pulses) may be compared to the actual pulse period.

The confidence level may be based on a comparison of the actual, current or latest pulse height with an estimated/predicted pulse height. In other words, an estimated pulse height (based on previous pulses) may be compared to the actual pulse height.

The confidence level may be based on a comparison of the actual, current or latest pulse height with an average of the pulse input signal. A small difference may be indicative of a pulse input signal that is not pulsed (e.g. confidence level is reduced) and/or a large difference may be indicative of a pulse input signal that is highly pulsed (e.g. confidence level increased).

The confidence level may be based on the estimated pulse period, PP_est, and the detected/actual pulse period. The confidence level may be increased if the observed or actual pulse period is equal to or is within a range from the estimated pulse period. The confidence level may be decreased if the observed or actual pulse period differs too much from the estimated pulse period. The confidence level may be in the range from 0 to 1.

The confidence level may be based on the estimated pulse height, and the detected/actual pulse height. The confidence level may be increased if the observed or actual pulse height is equal to or is within a range from the estimated pulse height. The confidence level may be decreased if the observed or actual pulse height differs too much, e.g. more than a threshold, from the estimated pulse height.

A hearing device is disclosed. The hearing device comprises a pulse detector for provision of a pulse output signal indicative of detection of a pulse; a first power estimator connected to the pulse detector, the first power estimator configured for provision of a first power output, e.g. based on a first power input and/or the pulse output signal; and a mixing module connected to the first power estimator for provision of a mixed output signal, e.g. based on the first power output and/or a filterbank output.

The filterbank may be a multi-band filterbank configured to split the input signal into multiple frequency bands $F\_1, \ldots, F\_N$, where N is an integer, such as larger than 10. The filterbank may be configured to calculate the (linear) power per band and output the linear power per band, also denoted $P\_L\_1, \ldots P\_L\_N$, as filterbank output.

The first power estimator may be a multi-band power estimator. The first power estimator may be configured to calculate a power estimate per band averaged over one pulse period, also denoted $P\_P\_1, \ldots, P\_P\_N$, e.g. based on the pulse output signal and the filterbank output (first power input). The first power estimator optionally adds and/or integrates power estimates from the filterbank output and divides the sum by the time passed since the last pulse was detected, resulting in multi-band power estimates average over one pulse period.

The mixing module may be a multi-band mixing module. The mixing module may be connected to the pulse detector for receiving a control signal, such as a confidence level. The control signal may control the mixing of the filterbank output and the first power output. In other words, the mixing module may be connected to the filterbank and the first power estimator for receiving the filterbank output and the first power output, respectively. For example, the confidence level may control a mixing ratio between the filterbank output and the first power output and/or coefficients applied to (multiplied with) the filterbank output and the first power output.

The hearing device may comprise a second power estimator for provision of a second power output. The second power output may be fed as pulse input signal to the pulse detector. The second power estimator may be configured to calculate a linear power estimate for provision of a broadband linear power estimate, also denoted $P\_L\_B$, as the second power output. In other words, the second power output may be a broadband linear power estimate.

The hearing device optionally comprises a converter for converting the mixed output signal to a converter output. The converter may be a logarithmic converter, i.e. the converter output may be in the dB domain.

The pulse detector is configured to obtain a pulse input signal and optionally to determine, e.g. in a first or rest state, if the pulse input signal satisfies a first rising criterion. The first rising criterion may be based on the pulse input signal and/or one or more thresholds.

The pulse detector is configured to, optionally in accordance with the pulse input signal satisfying the first rising criterion, increase the threshold and determine if the pulse input signal satisfies a first down count criterion.

The pulse detector is configured to, optionally in accordance with the pulse input signal satisfying the first down count criterion, initialize a down counter and determine if the down counter satisfies a second down count criterion.

The pulse detector is configured to, optionally in accordance with the down counter satisfying the second down count criterion, decrease the down counter and determine if the down counter satisfies a pulse detection criterion.

The pulse detector is configured to, optionally in accordance with the down counter satisfying the pulse detection criterion, output the pulse output signal indicative of detection of a pulse.

The pulse detector may be configured to move from the third state to a fourth state in accordance with the pulse detection criterion being satisfied. The pulse detector is optionally configured to, e.g. in the fourth state, update, determine, and/or calculate one or more pulse parameters optionally including one or more of a confidence level, an estimated pulse period, and an estimated pulse height. The pulse detector is optionally configured to, e.g. in the fourth state, reset, update, and/or initialize the threshold.

estimated pulse period, and an estimated pulse height. The one or more pulse parameters may be based on the detected/actual pulse (e.g. time of occurrence and height/amplitude) and one or more previously detected pulses (e.g. time of occurrence and height/amplitude). The one or more pulse parameters may be based on a previously determined confidence level.

According to the present disclosure, a pulse detector, e.g. for a hearing device, is disclosed, wherein the pulse detector is configured to obtain a pulse input signal; determine if the pulse input signal satisfies a first rising criterion; in accordance with the pulse input signal satisfying the first rising criterion, increase the threshold; determine if the pulse input signal satisfies a first down count criterion; in accordance with the pulse input signal satisfying the first down count criterion, initialize a down counter; determine if the down counter satisfies a second down count criterion; in accordance with the down counter satisfying the second down count criterion, decrease the down counter; determine if the down counter satisfies a pulse detection criterion; and in accordance with the down counter satisfying the pulse detection criterion, output the pulse output signal indicative of detection of a pulse.

FIG. 1 shows parts of an exemplary hearing device. The hearing device 2 comprises a pulse detector 4 for provision of a pulse output signal 4A indicative of detection of a pulse. The hearing device 2 comprises a first power estimator 6 for provision of a first power output 6A. The first power estimator 6 is connected to the pulse detector 4. The hearing device 2 comprises a mixing module 8 connected to the first power estimator 6 and configured for provision of a mixed output signal 8A. The hearing device 2 optionally comprises a filterbank 10 for provision of a filterbank output 10A. The output of the filterbank 10 is connected to the first power estimator 6 and the mixing module 8 for feeding the filterbank output 10A or at least part(s) thereof to the first power estimator 6 and the mixing module 8, respectively.

The first power estimator 6 or period smoother is configured for provision of a first power output 6A based on a first power input (filterbank output 10A) and the pulse output signal 4A. The first power estimator 6 provides a power estimate per frequency band, averaged over one pulse period. In other words, the first power estimator 6 smooths frequency-band power estimates over one period and the first power output 6A is a multi-band power estimate per band averaged over one pulse period.

The mixing module 8 is connected to the first power estimator 6 and the filterbank 10 and configured for provision of a mixed output signal 8A based on the first power output 6A and/or the filterbank output 10A. The filterbank output 10A may be a multi-channel output, e.g. separated in N frequency bands. N may be larger than 10. The filterbank output 10A is a linear power estimate per band, i.e. the filterbank 10 is a power estimator configured to estimate the linear power in each band.

The hearing device 2 optionally comprises a second power estimator 12 for provision of a second power output 12A. The second power output 12A is fed as a pulse input signal 4B to the pulse detector 4. The second power estimator 12 may be a linear power estimator providing a broadband linear power estimate. In other words, the second power output 12A may be a broadband linear power estimate.

The hearing device 2 comprises an input module 16 comprising one or more microphones and/or a transceiver module for provision of input signal 16A based on microphone input signal(s) and/or transceiver input signal(s), the input module 16 being connected to the filterbank 10 and the second power estimator 12 for feeding the input signal 16A to the filterbank 10 and the second power estimator 12, respectively. The input module 16 may be configured to pre-process microphone input signal(s) and/or transceiver input signal(s), the pre-processing optionally including beamforming and/or feedback suppression.

The hearing device 2 optionally comprises a converter 14, such as a logarithmic converter, for converting the mixed output signal 8A to the dB domain.

The elements 4, 6, 8, 10, 12, 14 may collectively be referred to as a warped filterbank 20. In other words, the hearing device 2 optionally comprises a warped filterbank 20.

The pulse detector 4 is configured to obtain a pulse input signal 4B and determine if the pulse input signal 4B satisfies a first rising criterion. In accordance with the input signal satisfying the first rising criterion, the pulse detector 4 is configured to increase the threshold and determine if the pulse input signal satisfies a first down count criterion based on the threshold. In accordance with the pulse input signal satisfying the first down count criterion, the pulse detector 4 is configured to initialize a down counter and determine if the down counter satisfies a second down count criterion. In accordance with the down counter satisfying the second down count criterion, the pulse detector 4 is configured to decrease the down counter and determine if the down counter satisfies a pulse detection criterion. In accordance with the down counter satisfying the pulse detection criterion, the pulse detector 4 is configured to output the pulse output signal 4A indicative of detection of a pulse.

The first power estimator 6 is controlled by the pulse output signal 4A. In one or more exemplary hearing devices/warped filter banks, the pulse output signal 4A triggers the calculation of the period power in the first power estimator 6, e.g. by dividing accumulated energy since last pulse detection with the time between last detected pulse and the presently detected pulse as indicated by the pulse output signal 4A. The first power estimator may comprise a period timer that is reset every time a pulse is detected.

The pulse detector may be configured to obtain, such as determine, a confidence level $C\_L$, e.g. when moving to the first state, and control the mixing module 8 based on the confidence level $C\_L$. For example, a high confidence level may increase the amount of first power output 6A in the mixed output signal 8A and/or a low confidence level may decrease the amount of first power output 6A in the mixed output signal 8A.

Additionally or alternatively, a high confidence level may decrease the amount of filterbank output 10A in the mixed output signal 8A and/or a low confidence level may increase the amount of filterbank output 10A in the mixed output signal 8A.

Figure 2:
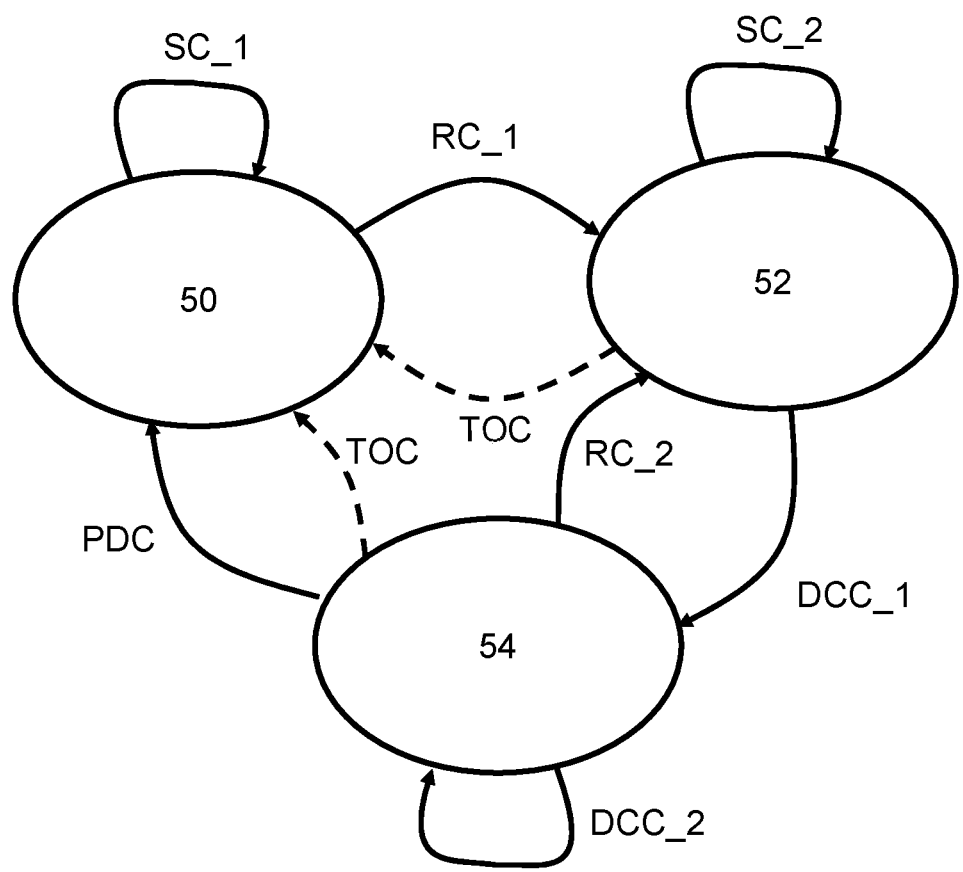
FIG. 2 is an exemplary state diagram of a pulse detector.

FIG. 2 is an exemplary state diagram of a pulse detector. The pulse detector starts in a first state 50 also referred to as rest state. The pulse detector stays in the first state 50 if first stay criterion SC_1 is satisfied, i.e. if the pulse input signal $x<=TH\_1$, where TH_1 is a threshold. Staying in the first state, i.e. in accordance with the first stay criterion being satisfied, comprises updating the threshold by decreasing the threshold TH_1. If an input pulse arrives, the pulse input signal x rises above the threshold TH_1 and the first rising criterion RC_1: $x>TH\_1$ is satisfied, and the pulse detector moves to the second state 52 or rising state. In the second state 52, the threshold TH_1 is set to the input pulse signal, i.e. TH_1 :=x. If the pulse passes, the input pulse signal x drops below the threshold TH_1 (first down count criterion DCC_1 is satisfied, $x<TH\_1$) and the pulse detector transitions or moves from the second state 52 into the third state 54 (down count state). When moving to the third state 54, a down counter (c) is initialized by setting the down counter c to a value based on an expected fundamental period, e.g. $c=a1*t\_fun$, where a1 is a value in the range from 0 to 1, such as in the range from 0.2 to 0.5, e.g. 0.33 (⅓), and t_fun is an expected fundamental period.

The pulse detector may in the second state 52 determine if the pulse input signal satisfies a second stay criterion SC_2, e.g. if $x>=TH\_1$, which is indicative of a rising edge of the pulse input signal. In accordance with the pulse input signal satisfying the second stay criterion, the pulse detector may update the threshold by setting the threshold to the value of the pulse input signal, i.e. TH_1: =x and stay in the second state.

Updating the threshold may comprise setting or calculating the threshold based on the pulse input signal, e.g. equalizing the threshold TH_1 to the pulse input signal x.

In the third state 54, the pulse detector optionally moves to the second state 52 in accordance with a second rising criterion RC_2 being satisfied. The second rising criterion may be satisfied if an increase in the pulse input signal above the threshold is detected before the down counter reaches zero. The pulse detector is optionally configured to adapt or update the threshold TH_1 in accordance with the second rising criterion being satisfied, e.g. by setting the threshold to the value of the pulse input signal, i.e. TH_1:=x.

In the third state, the pulse detector determines if a second down count criterion DCC_2 is satisfied (c>0) and in accordance with the second down count criterion being satisfied, the pulse detector is configured to update the down counter by degreasing the down counter c e.g. by setting c:=c−1.

The pulse detector is configured to, in the third state 54, determine if a pulse detection criterion PDC is satisfied, e.g. if the down counter c reaches zero or below zero optionally while the pulse input signal x stays below the threshold. In accordance with the pulse detection criterion being satisfied, the pulse detector returns to the first state 50 and outputs a pulse output signal indicative of detection of a pulse.

In the second state, the threshold is increased to track the current signal value of the pulse input signal. This ensures that the largest peak is detected, even if it is preceded by a slightly smaller spike in the pulse input signal. In the second state (down count), the threshold is maintained at its current value. In the first state, the threshold is continuously decreased, e.g. in accordance with the first stay criterion being satisfied.

The pulse detector may be configured to initialize a timer counter, e.g. when moving from the second state to the third state (i.e. when a peak is detected) and/or when moving from the first state to the second state). The pulse detector may be configured to move to the first state 50 from the second state 52 and/or the third state 54 in accordance with a timeout criterion TOC based on the timer counter being satisfied. Thereby is ensured that the pulse detector does not get stuck in the second state and/or the third state, e.g. if pulses are too close to each other.

It is to be understood that one or more criteria such as the down count criteria DCC_1 and DCC_2 may be implemented using one or more up counters and thresholds for up counter values.

Figure 3:
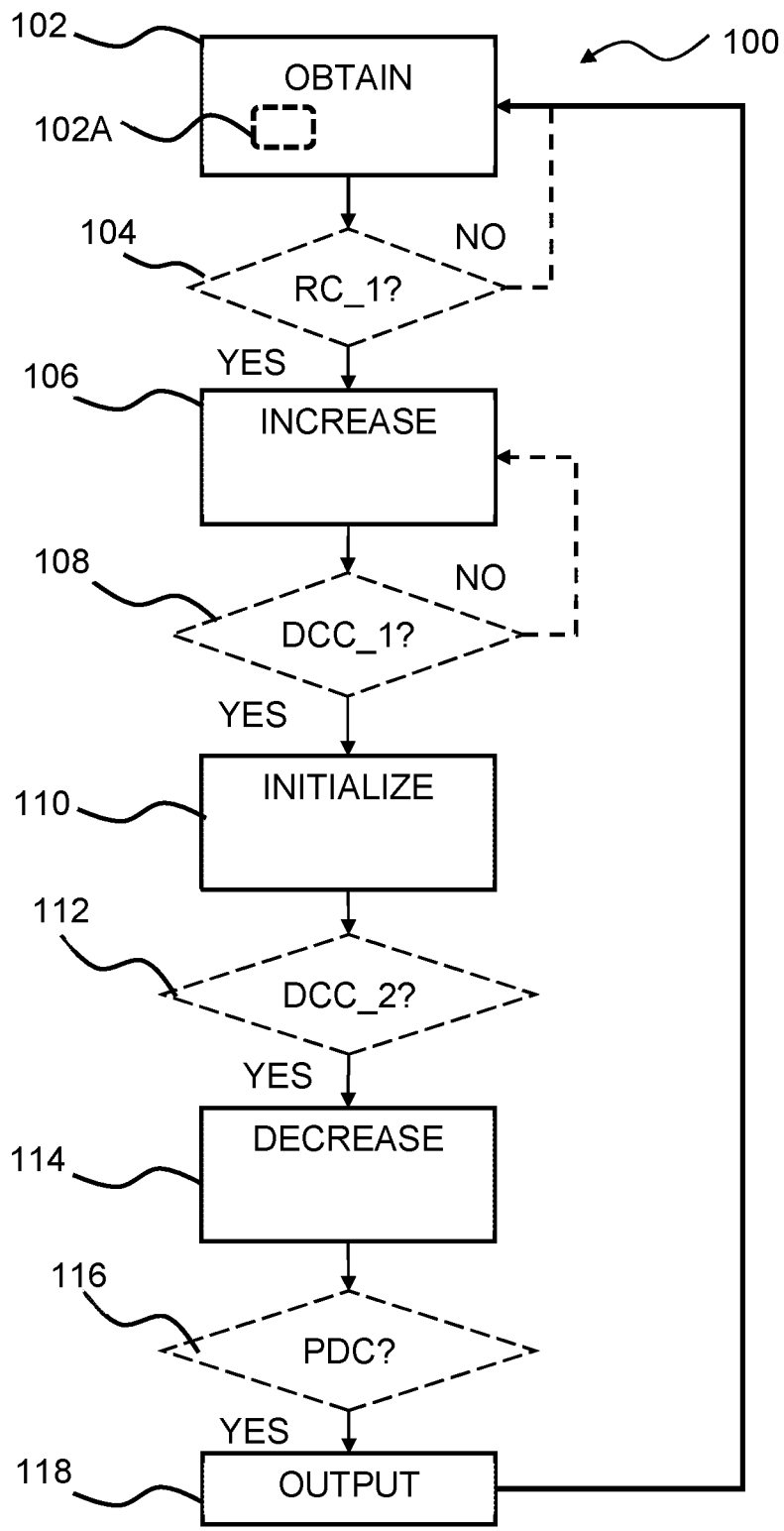
FIG. 3 is a flow diagram of an exemplary method according to the disclosure.

FIG. 3 shows a flow diagram of an exemplary method of pulse detection and/or power estimation in a hearing device, the method 100 comprising obtaining 102 a pulse input signal; determining 104 if the pulse input signal satisfies a first rising criterion RC_1; in accordance with the input signal satisfying the first rising criterion, increasing/updating 106 a threshold; determining 108 if the pulse input signal satisfies a first down count criterion DCC_1; in accordance with the pulse input signal satisfying the first down count criterion, initializing 110 a down counter; determining 112 if the down counter satisfies a second down count criterion DCC_2; in accordance with the down counter satisfying the second down count criterion, decreasing/updating 114 the down counter; determining 116 if the down counter satisfies a pulse detection criterion PDC; and in accordance with the down counter satisfying the pulse detection criterion, outputting 118 a pulse output signal indicative of detection of a pulse.

Obtaining 102 a pulse input signal may comprise obtaining 102A a broadband linear power estimate.

Figure 4:
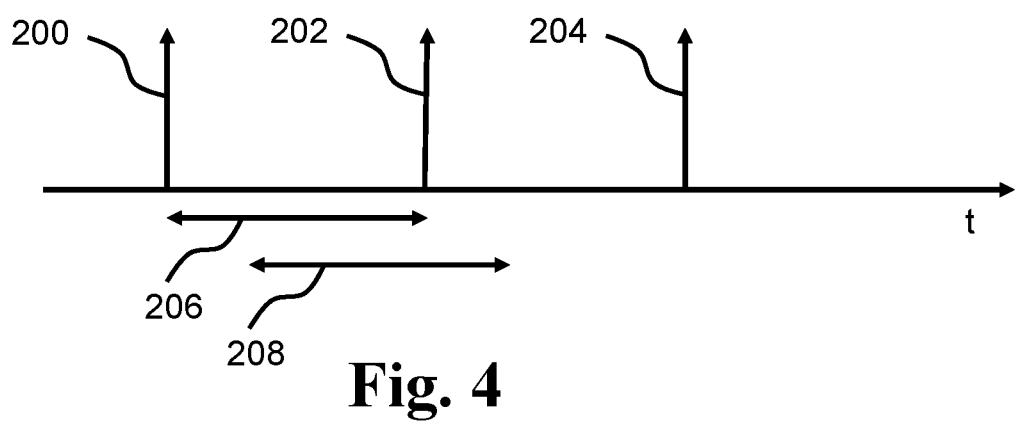
FIG. 4 illustrates smoothing period alignment.

FIG. 4 illustrates pulse detection and power smoothing according to the present disclosure. A pure pulse train comprising first pulse 200, second pulse 202, and third pulse 204 is used as input signal. The pulse train has an average power of P. The line 206 indicates a smoothing period aligned with the exact moment that the first pulse 200 is detected. moment. The line 208 indicates a smoothing period aligned with pulse detection according to the present disclosure. For the smoothing period 206, an infinitely small error or even a slight error in the start and end of the smoothing period would vary the number of pulses located in this period between 0 and 2, resulting in an average power estimate fluctuating between 0 and 2P. For the smoothing period 208, a slight misalignment in the start and end of the smoothing period will only have affect the estimate due to a change in period time. Thus, the power smoothing and power estimation according to the present disclosure is much more robust against pulse detection errors. It is an important advantage of the present disclosure that one pulse per smoothing period is ensured.

Figure 5:
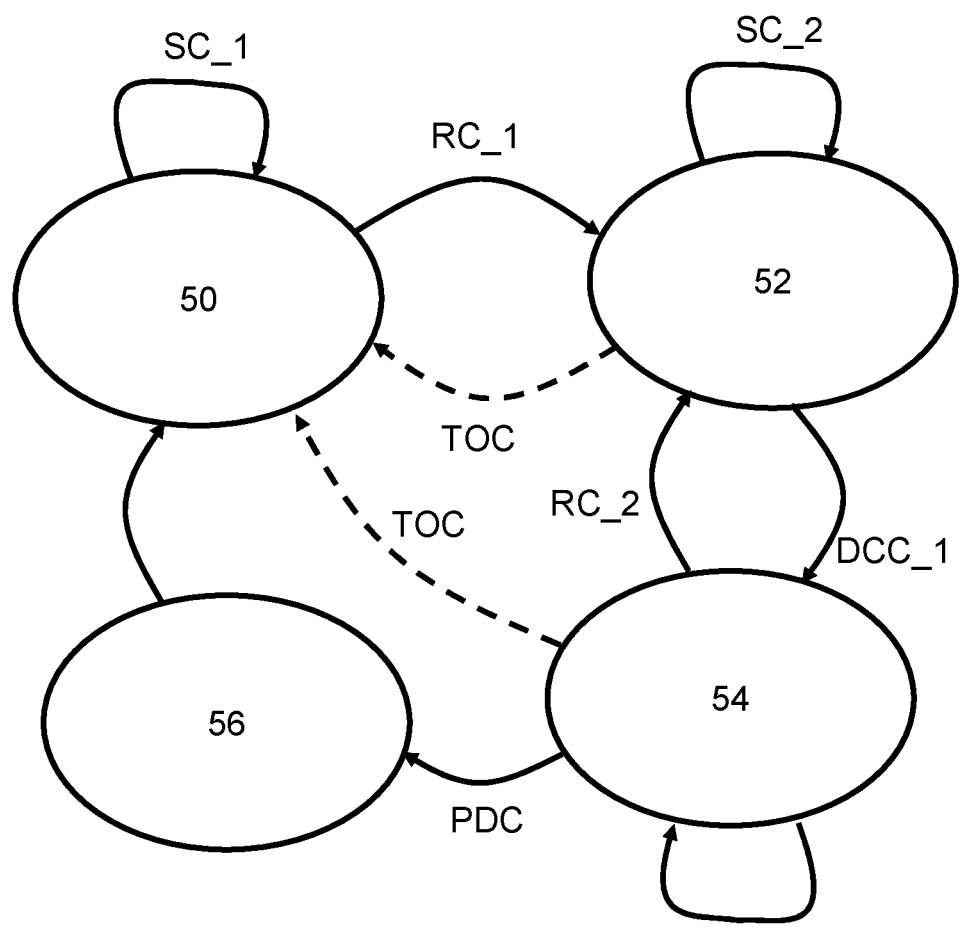
FIG. 5 is an exemplary state diagram of a pulse detector.

FIG. 5 is an exemplary state diagram of a pulse detector. The state diagram comprises a fourth state 56 also denoted an update state. The pulse detector moves from the third state 54 to the fourth state 56 in accordance with the pulse detection criterion being satisfied. The pulse detector is configured to, e.g. in the fourth state 56, update, determine, and/or calculate one or more pulse parameters optionally including one or more of a confidence level, an estimated pulse period, and an estimated pulse height. The one or more pulse parameters may be based on the detected/actual pulse (e.g. time of occurrence and height/amplitude) and one or more previously detected pulses (e.g. time of occurrence and height/amplitude). The one or more pulse parameters may be based on the a previously determined confidence level.

The use of the terms "first", "second", "third" and "fourth", "primary", "secondary", "tertiary" etc. does not imply any particular order, but are included to identify individual elements. Moreover, the use of the terms "first", "second", "third" and "fourth", "primary", "secondary", "tertiary" etc. does not denote any order or importance, but rather the terms "first", "second", "third" and "fourth", "primary", "secondary", "tertiary" etc. are used to distinguish one element from another. Note that the words "first", "second", "third" and "fourth", "primary", "secondary", "tertiary" etc. are used here and elsewhere for labelling purposes only and are not intended to denote any specific spatial or temporal ordering.

Furthermore, the labelling of a first element does not imply the presence of a second element and vice versa.

It may be appreciated that FIGS. 1-5 comprise some modules or operations which are illustrated with a solid line and some modules or operations which are illustrated with a dashed line. The modules or operations which are comprised in a solid line are modules or operations which are comprised in the broadest example embodiment. The modules or operations which are comprised in a dashed line are example embodiments which may be comprised in, or a part of, or are further modules or operations which may be taken in addition to the modules or operations of the solid line example embodiments. It should be appreciated that these operations need not be performed in order presented. Furthermore, it should be appreciated that not all of the operations need to be performed. The exemplary operations may be performed in any order and in any combination.

It is to be noted that the word "comprising" does not necessarily exclude the presence of other elements or steps than those listed.

It is to be noted that the words "a" or "an" preceding an element do not exclude the presence of a plurality of such elements.

It should further be noted that any reference signs do not limit the scope of the claims, that the exemplary embodiments may be implemented at least in part by means of both hardware and software, and that several "means", "units" or "devices" may be represented by the same item of hardware.

The various exemplary methods, devices, and systems described herein are described in the general context of method steps processes, which may be implemented in one aspect by a computer program product, embodied in a computer-readable medium, including computer-executable instructions, such as program code, executed by computers in networked environments. A computer-readable medium may include removable and non-removable storage devices including, but not limited to, Read Only Memory (ROM), Random Access Memory (RAM), compact discs (CDs), digital versatile discs (DVD), etc. Generally, program modules may include routines, programs, objects, components, data structures, etc. that perform specified tasks or implement specific abstract data types. Computer-executable instructions, associated data structures, and program modules represent examples of program code for executing steps of the methods disclosed herein. The particular sequence of such executable instructions or associated data structures represents examples of corresponding acts for implementing the functions described in such steps or processes.

Although features have been shown and described, it will be understood that they are not intended to limit the claimed invention, and it will be made obvious to those skilled in the art that various changes and modifications may be made without departing from the spirit and scope of the claimed invention. The specification and drawings are accordingly to be regarded in an illustrative rather than restrictive sense. The claimed invention is intended to cover all alternatives, modifications, and equivalents.

LIST OF REFERENCES 2 hearing device
4 pulse detector
4A pulse output signal
4B pulse input signal
6 first power estimator, period smoother
6A first power output
8 mixing module/mixer
8A mixed output signal
10 filterbank
10A filterbank output
12 second power estimator
12A second power output
14 converter
16 input module
16A input signal
20 warped filterbank
50 first state/rest state
52 second state/rising state
54 third state/down count state
56 fourth state/update state
100 method of pulse detection and/or power estimation in a hearing device
102 obtaining a pulse input signal
102A obtaining a broadband linear power estimate
104 determining if the pulse input signal satisfies a first rising criterion RC_1
106 increasing a threshold
108 determining if the pulse input signal satisfies a first down count criterion DCC_1
110 initializing a down counter;
112 determining if the down counter satisfies a second down count criterion DCC_2
114 decreasing the down counter
116 determining if the down counter satisfies a pulse detection criterion PDC
118 outputting a pulse output signal indicative of detection of a pulse
200 first pulse
202 second pulse
204 third pulse
206 smoothing period
208 smoothing period of first power estimator

The invention claimed is:

1. A method performed by a hearing device, the method comprising:
obtaining a pulse input signal;
determining whether the pulse input signal satisfies a first rising criterion;
after the pulse input signal is determined as satisfying the first rising criterion, increasing a threshold;
determining whether the pulse input signal satisfies a first down count criterion;
after the pulse input signal is determined as satisfying the first down count criterion, initializing a down counter;
determining whether the down counter satisfies a second down count criterion;
after the down counter is determined as satisfying the second down count criterion, decreasing the down counter;

determining whether the down counter satisfies a pulse detection criterion; and after the down counter is determined as satisfying the pulse detection criterion, outputting a pulse output signal indicative of detection of a pulse.

2. The method of claim 1, further comprising:

after the pulse input signal is determined as satisfying the first down count criterion, determining whether the pulse input signal satisfies a second rising criterion; and after the pulse input signal is determined as satisfying the second rising criterion, increasing the threshold.

3. The method of claim 1, further comprising:

after the down counter is determined as satisfying the pulse detection criterion, determining whether the pulse input signal satisfies a rest criterion; and after the pulse input signal is determined as satisfying the rest criterion, decreasing the threshold.

4. The method of claim 1, wherein the act of initializing the down counter comprises:

estimating a pulse period; and setting the down counter based on the estimated pulse period.

5. The method of claim 1, wherein the pulse output signal comprises a pulse height of the detected pulse.

6. The method of claim 1, further comprising:

after the pulse input signal is determined as satisfying the first down count criterion, determining whether a timeout criterion is satisfied; and after the timeout criterion is determined as being satisfied, resetting the threshold.

7. The method of claim 1, further comprising estimating an estimated pulse period based on the detected pulse and a previously detected pulse.

8. The method of claim 1, further comprising estimating an estimated pulse height based on the detected pulse.

9. The method of claim 1, further comprising:

smoothing a first power input based on the pulse output signal for provision of a first power output; and mixing the first power output and a filterbank output for provision of a mixed output signal.

10. The method of claim 9, further comprising determining a confidence level, wherein the act of mixing the first power output and the filterbank output for provision of the mixed output signal is performed based on the confidence level.

11. A hearing device comprising a pulse detector for provision of a pulse output signal indicative of a detection of a pulse;

a first power estimator connected to the pulse detector, the first power estimator configured for provision of a first power output based on a first power input and the pulse output signal; and a mixing module connected to the first power estimator for provision of a mixed output signal based on the first power output and a filterbank output;

wherein the pulse detector is configured to:

obtain a pulse input signal;

determine whether the pulse input signal satisfies a first rising criterion;

after the pulse input signal is determined as satisfying the first rising criterion, increase a threshold;

determine whether the pulse input signal satisfies a first down count criterion;

after the pulse input signal is determined as satisfying the first down count criterion, initialize a down counter;

determine whether the down counter satisfies a second down count criterion;

after the down counter is determined as satisfying the second down count criterion, decrease the down counter;

determine whether the down counter satisfies a pulse detection criterion; and after the down counter is determined as satisfying the pulse detection criterion, output the pulse output signal indicative of the detection of the pulse.

12. A pulse detector, wherein the pulse detector is configured to:

obtain a pulse input signal;

determine whether the pulse input signal satisfies a first rising criterion;

after the pulse input signal is determined as satisfying the first rising criterion, increase the threshold;

determine whether the pulse input signal satisfies a first down count criterion;

after the pulse input signal is determined as satisfying the first down count criterion, initialize a down counter;

determine whether the down counter satisfies a second down count criterion;

after the down counter is determined as satisfying the second down count criterion, decrease the down counter;

determine whether the down counter satisfies a pulse detection criterion; and after the down counter is determined as satisfying the pulse detection criterion, output a pulse output signal indicative of a detection of a pulse.

\* \* \* \* \*